United States Patent [19]
Reich

[11] Patent Number: 4,827,515
[45] Date of Patent: May 2, 1989

[54] DIGITAL DEMODULATOR

[75] Inventor: Werner Reich, Emmendingen, Fed. Rep. of Germany

[73] Assignee: Deutsche ITT Industries GmbH, Freiburg, Fed. Rep. of Germany

[21] Appl. No.: 220,144

[22] Filed: Jul. 15, 1988

[30] Foreign Application Priority Data

Aug. 26, 1987 [EP] European Pat. Off. ........ 87112371.7

[51] Int. Cl.$^4$ .............................................. H04H 5/00
[52] U.S. Cl. ...................................................... 381/7
[58] Field of Search ................................ 381/2, 3, 4, 7

[56] References Cited

U.S. PATENT DOCUMENTS 4,404,430 9/1983 Ogita ........................................ 179/1
4,485,483 11/1984 Torick et al. ......................... 381/14

FOREIGN PATENT DOCUMENTS 0124031 11/1984 European Pat. Off. .
3314603 10/1984 Fed. Rep. of Germany .
3433592 3/1986 Fed. Rep. of Germany .
8403807 9/1984 PCT Int'l Appl. .
2068686 8/1981 United Kingdom .

OTHER PUBLICATIONS

"Neue Entwicklung auf Hörfunkwellen", *Funkschau*, vol. 58, No. 1, Jan. 1986, by H. Dernedde-Jessen et al., pp. 63–74.

"Grünes Licht für den Verkehrsfunk", *Funkschau*, vol. 46, No. 14, Jul. 1974, by J. Conrad, pp. 535–538.

*Primary Examiner*—Forester W. Isen
*Attorney, Agent, or Firm*—Thomas L. Peterson

[57] ABSTRACT

A digital demodulator demodulates and separates the individual components of a digitized stereo multiplex signal which contains a narrowband information channel at three times the pilot signal frequency. Demodulation is accomplished by means of five digital demodulators to which respective carriers are applied from a carrier conditioning circuit. Each carrier has a frequency of the pilot signal frequency, twice the pilot signal frequency or three times the pilot signal frequency. The carriers are generated as data word sequences which contain only the values +1, −1 and 0. The sampling interval for four of the carriers are 90°, and the sampling interval for the remaining carrier is 60°, beginning from 0°. The signal sampling frequencies are adapted to the different sampling frequencies of the carriers by means of decimation circuits. Each of the six components is freed from interfering adjacent signals by a low-pass filter.

11 Claims, 3 Drawing Sheets

DIGITAL DEMODULATOR

BACKGROUND OF THE INVENTION

The present invention relates to a digital demodulator for use in demodulating FM stereo broadcast signals. A digital demodulator of this kind is described as part of a digital quadrature amplitude modulation and demodulation circuit in Offenlegungsschrift No. DE-A 33 14 603.

SUMMARY OF THE INVENTION

Starting from the prior art demodulator circuit, the object of the invention as claimed is to provide a digital demodulator for a digitized standard stereo multiplex signal ("MPX signal"). A possible stereo multiplex standard for FM broadcast signals is described, for example, in "Funkschau," 1974, pp. 535–538 and 1986, No. 1, pp. 43–47. According to that standard, there is an additional narrowband information channel at 57 kHz, which is three times the stereo pilot signal frequency.

One of the advantages gained by the invention is that, as a result of the digital frequency conversion during demodulation, a steady quality of the separation of the MPX signal components is obtained, because aging and temperature have no effect on the demodulators and filters. Another advantage lies in the fact that the processing of the demodulated signals (i.e., the decoding of the right and left signals and the processing of the signals of the information channel), for example, can be performed together with the digital demodulation within a single monolithic integrated circuit.

DETAILED DESCRIPTION OF THE PREFERRED EMBODIMENT

Figure 1:
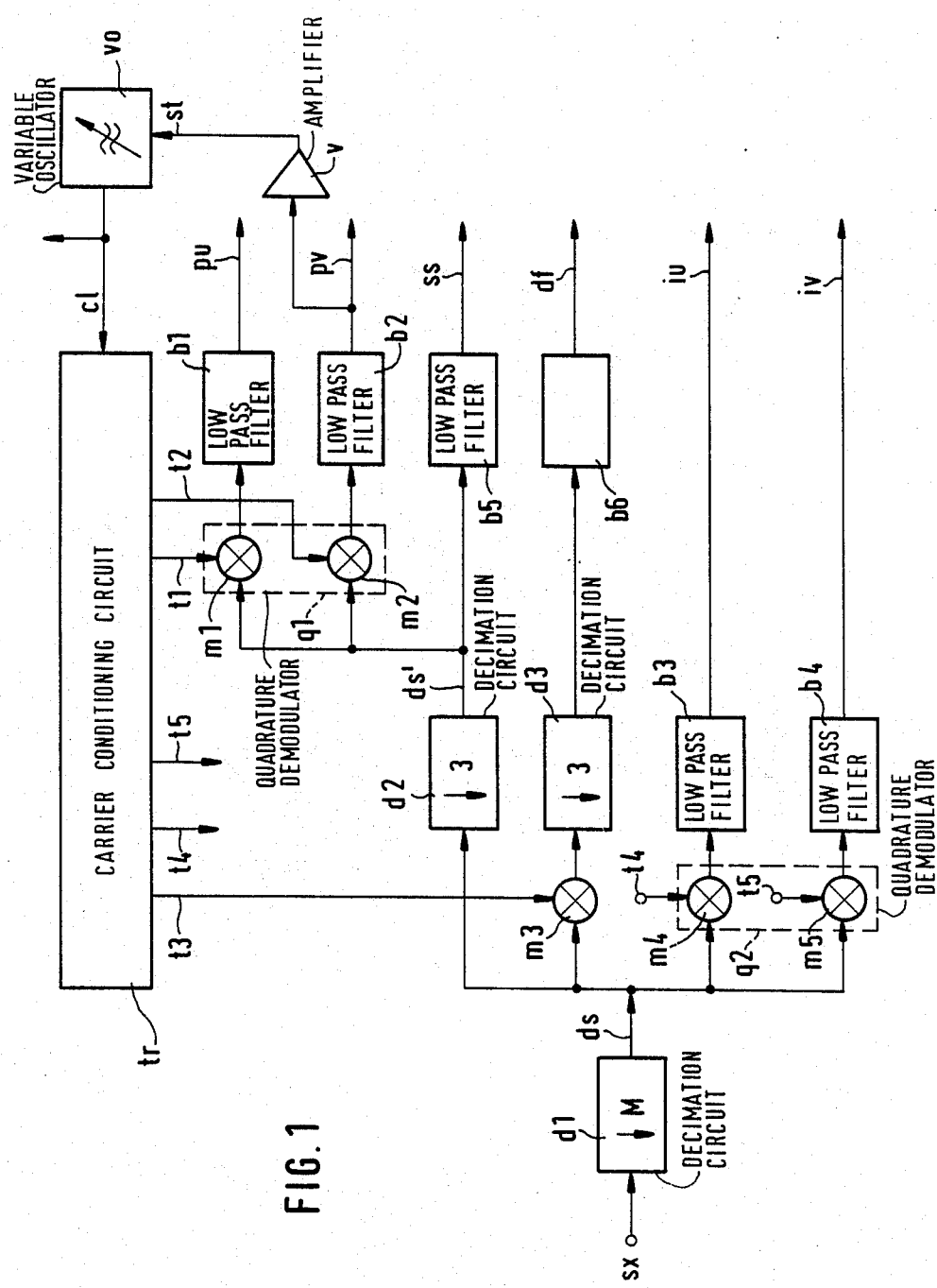
FIG. 1 is a block diagram of an embodiment of the invention.

In the block diagram of FIG. 1, a digitized MPX signal sx is applied to a first decimation circuit d1. Depending on the sampling rate fa of a preceding analog-to-digital converter (not shown) or a preceding digital signal processing circuit (not shown), a decimation factor M is chosen so that the sampling rate at the output of the first decimation circuit d1 is equal to 12 times the pilot signal frequency fp (i.e., the control signal subcarrier frequency).

As is well known, the reduction of the sampling rate has the advantage of reducing the clock frequency of following subcircuits, so that the digital filter circuits can be constructed with fewer stages and require correspondingly less area on an integrated circuit chip. Therefore, it is advantageous to adapt the sampling rate to the maximum useful signal frequency to be processed. The sampling rate must not be lower than twice the value of the useful signal frequency, however. As a rule, each decimation circuit includes a filter portion, which prevents aliasing during decimation, and an electronic switch, which transfers the filtered signals to the abovementioned subcircuits at the sampling rate at the output of the decimation circuit. The respective decimation factor of the sampling frequency is given in the decimation circuits of FIG. 1 behind a downwardly pointing arrow.

The output of the first decimation circuit d1 is a first decimated composite signal ds, which is applied to a second decimation circuit d2. The second decimation circuit d2 has a decimation factor of 3.

The output of the second decimation circuit d2 is the second decimated composite signal ds'. The output of the second decimation circuit d2 is connected to the signal inputs of a first digital demodulator m1 and a second digital demodulator m2. The first demodulator m1 and the second demodulator m2 have carrier inputs that are fed by the first carrier t1 and the second carrier t2, respectively. The second carrier t2 is in quadrature with the first carrier t1. The first and second digital demodulators m1, m2 form a first quadrature demodulator q1.

As described in Offenlegungsschrift No. DE-A 33 14 603, the design of digital modulators and demodulators becomes especially simple if, of the sinusoidal carriers to be applied, only their preferably normalized values at 0°, 90°, 180° and 270° are used, because this quantized carrier then has only the values +1, −1 and 0, which are easy to digitize. For these specific values, the digital modulator and demodulator may only have to change the sign of the digitized input signal or provide the output value 0.

The output of the first digital demodulator m1 is connected to the input of a first low-pass filter b1; and the output of the second digital demodulator m2 is connected to the input of a second low-pass filter b2. In the first low-pass filter b1 and the second low-pass filter b2, the signals from the first and second digital demodulators m1, m2 are freed from all higher and interfering frequency components, particularly from signals from the adjacent audio frequency range, and thus appear as stationary signals, so to speak, namely as the in-phase component pu and the quadrature component pv of the pilot signal ps transformed down to zero. The signal frequency fs, i.e., the fundamental frequency of the first and second carriers t1, t2, is equal to the pilot signal frequency fp, namely 19 kHz, while the sampling frequency fa is four times the pilot signal frequency. The sampling frequency of the signals provided at the outputs of the first and second digital demodulators m1, m2 is very high compared with the frequency of these signals, which is practically zero, so that the sampling rate after the first and second demodulators m1, m2 should be greatly decimated. This decimation simplifies the following first and second low-pass filters b1, b2 as described, the respective one or multi-stage decimation circuit then having to be added to the respective low-pass filter b1, b2 as a subcircuit.

To separate its other signal components, the first decimated composite signal ds is also applied to the signal inputs of third, fourth and fifth digital demodulators m3, m4, m5. The third, fourth and fifth digital demodulators m3, m4 and m5 have carrier inputs that are fed by third, fourth and fifth carriers t3, t4, t5, respectively. These carriers are also digitized sine or cosine wave signals which, like the first carrier pair t1, t2, have only the three values +1, −1 and 0.

The sampling frequency of these three carriers t3, t4, t5 is twelve times the pilot signal frequency (i.e., 12fp). The frequency of the third carrier t3 is twice the pilot signal frequency (i.e., 2fp), while the frequencies of the fourth and fifth carriers t4, t5 are three times the pilot signal frequency (i.e., 3fp). The carrier t4 is the sinusoidal carrier and the carrier t5 is the cosinusoidal carrier, so that the two carriers t4, t5 differ in phase by 90°.

Figure 4:
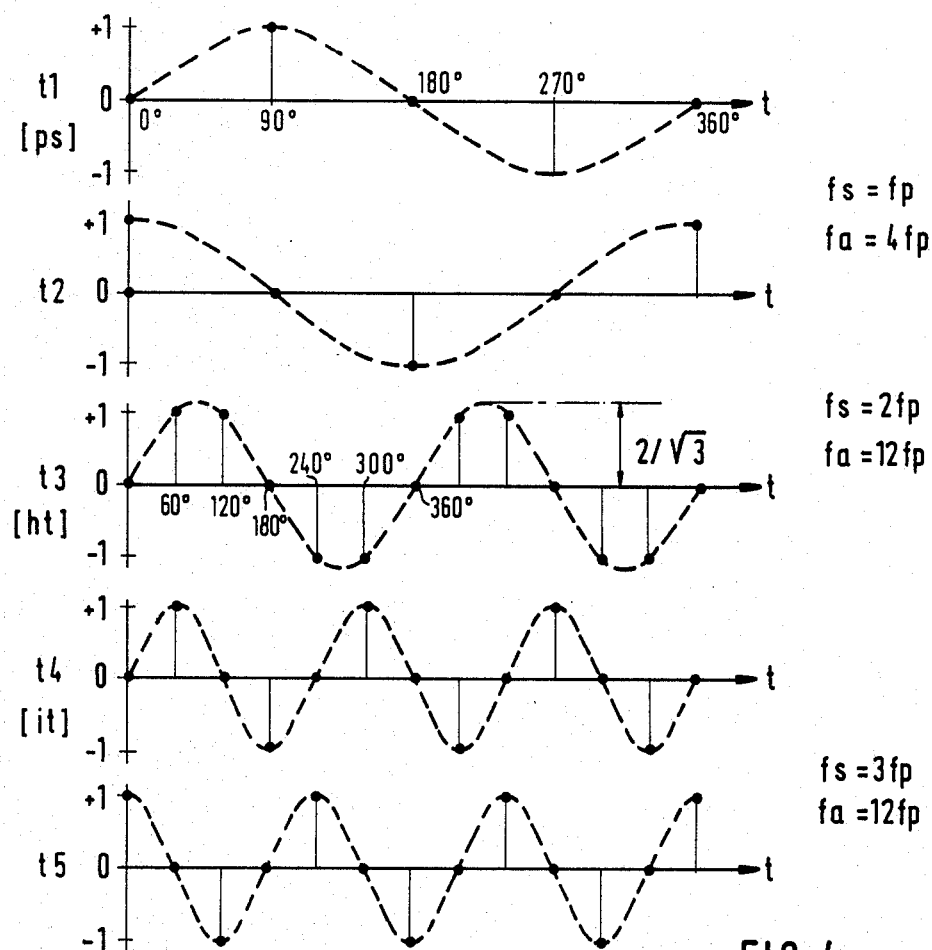
FIG. 4 illustrates exemplary waveforms of the carrier signals produced by the carrier conditioning circuit of FIG. 1.

The fourth and fifth carriers t4, t5 are sampled at 0°, 90°, 180° and 270°, with the signal amplitude normalized to 1. The third carrier t3 is sampled at the angles 0°, 60°, 120°, 180°, 240°, 300°, 360°, . . . in each signal period. The sinusoidal signal curve of the third carrier t3 has the amplitude $2\sqrt{3}$, as illustrated in FIG. 4.

The fourth and fifth digital demodulators m4, m5 together form a second quadrature demodulator q2. In the standard MPX signal, the amplitudes of the stereo sum signal ss and the demodulated stereo difference signal df are so chosen that, by forming the sum or the difference of these signals as is commonly done in stereo decoders, for example, the left and right signals are obtained directly. Since, in the present invention, the undemodulated stereo difference signal df*, which is present as a double sideband signal, is demodulated by a multiplying demodulator, the amplitude of the carrier enters into the amplitude of the demodulated stereo difference signal df as a multiplication factor. Accordingly, the demodulated stereo difference signal df is too large by this factor and must subsequently be reduced by this factor in relation to the stereo sum signal ss.

Only the demodulated stereo difference signal df of the output of the third digital demodulator m3 has to be processed as a useful signal. The demodulated stereo difference signal df has an upper limit at 15 kHz and has not yet been freed from interfering components. Thus, the sampling rate of twelve times the pilot signal frequency (i.e., 12fp) of this output signal is unnecessarily high. Furthermore, the desired sampling rate must be adapted to that of the stereo sum signal ss at the output so as to facilitate the joint further processing of the demodulated stereo difference signal df and the stereo sum signal ss in, e.g., the above-mentioned stereo decoder (not shown in FIG. 1). Therefore, the third digital demodulator m3 is followed by a third decimation circuit d3, which has the same decimation factor (e.g., 3) as the second decimation circuit d2.

The components of interest in the outputs of the fourth and fifth digital demodulators m4, m5 are the information signal's in-phase component iu and quadrature component iv, respectively. The in-phase component iu is filtered out by a third low-pass filter b3, which is connected to the output of the fourth digital demodulator m4; and the quadrature component iv is filtered out by a fourth low-pass filter b4, which is connected to the output of the fifth digital demodulator m5. The passbands of the third and fourth low-pass filters b3, b4, which are preferably identical in design, are approximately equal to half the bandwidth of the information channel ik.

The output of the second decimation circuit d2, namely the second decimated composite signal ds', contains the stereo sum signal ss and the pilot signal ps. The pilot signal ps is located at 19 kHz in accordance with the FM stereo broadcast standard. The pilot signal ps contains, as interfering signals, the frequency components of the MPX signal sx above 19 kHz, particularly the undemodulated stereo difference signal df* in the 23–53 kHz range, and also the aliasing signals and any noise that may be present. The interfering signals are suppressed by low-pass filtering. To produce the stereo sum signal ss, the second decimation circuit d2 is therefore followed by a fifth low-pass filter b5, whose stopband begins above the maximum possible audio signal frequency. Any residual components of the pilot signal ps in the stereo sum signal ss are hardly disturbing because they have only the frequency of the pilot signal ps, so that they can be easily filtered out in subsequent signal processing circuits.

To obtain the demodulated stereo difference signal df from the output of the third decimation circuit d3, the third decimation circuit d3 is followed by a sixth low-pass filter b6, whose passband and stopband are preferably identical with those of the fifth low-pass filter b5. Interfering components in the output of the third decimation circuit d3 are the aliasing signals and possible noise components, but particularly the stereo sum signal, transformed into the 23–53 kHz range. The pilot signal ps is at 19 kHz again, and residual components in the demodulated stereo difference signal df can be easily filtered out in subsequent signal processing circuits.

Within the fifth and sixth low-pass filters b5, b6, further decimation, e.g., by a factor of 2, is advantageous, because the maximum possible audio signal frequency (15 kHz) permits a further reduction of the sampling rate from 76 kHz to 38 kHz after the second and third decimation circuits d2, d3.

All six low-pass filters b1–b6 thus serve to free the signal components of interest from other signal components. The latter can be the aliasing signals resulting from the sampling, the unavoidable noise signals or components of the digitized MPX signal sx, which are brought to another frequency by the frequency conversion in the digital demodulators m1–m5. Preferably, the six low-pass filters b1–b6 contain further decimation circuits to further reduce the sampling rate, which must not pass below twice the maximum possible frequency of the respective signal components, however.

In FIG. 1, the quadrature component pv of the pilot signal ps, which component was transformed down to zero, is amplified by an amplifier v and then applied as a control signal st to a variable frequency and phase oscillator vo. The output of the variable oscillator vo is the system clock signal c1. This clock signal c1 controls a carrier conditioning circuit tr, which derives the five digital carriers t1–t5 via frequency dividers, for example. The variable oscillator vo is part of a phase-locked loop which is completed via the carrier conditioning circuit tr, one of the five carriers t1–t5 with the respective associated low-pass filter b1–b4, b6, and the control signal st. In the simplest case, as shown in FIG. 1, the phase comparison signal is the quadrature component pv of the pilot signal ps at zero frequency, amplified by the amplifier v. The magnitude and sign of this signal represent the angular deviation of the first carrier t1 from the received pilot signal ps. The phase-locked loop tries to reduce this error and, thus, the quadrature component pv to zero.

Figure 2:
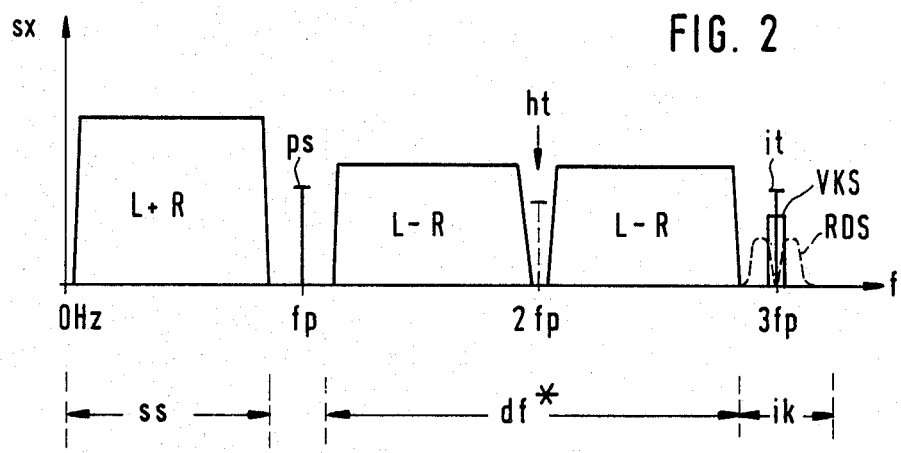
FIG. 2 illustrates the frequency spectrum of an MPX signal with an additional information channel.

FIG. 2 shows the frequency spectrum of the digitized composite signal in an analog representation. The digitized composite signal is the digitized MPX signal sx, including the information channel ik. In the ideal case, the stereo subcarrier ht of the undemodulated stereo difference signal df* is completely suppressed. The information channel ik at the information carrier it is narrowband in comparison with the audio signals. The range of the traffic information identifying signal ("VKS") and the associated information carrier it at three times the frequency (3fp) of the pilot signal ps are shown schematically by solid lines. Dashed lines indicate the frequency range of the radio data signal ("RDS"), whose carrier is separated in phase from the information carrier it by 90° and is suppressed. These two information signals VKS, RDS can be separated from each other if the associated quadrature components are present with the correct phase when being converted in frequency by means of the fourth carrier t4 and the fifth carrier t5, respectively.

The phase relationships between the pilot signal ps, the stereo subcarrier ht, and the information carrier it in the MPX signal sx are so established at the transmitting end that, at a positive zero crossing of the pilot signal ps, both the stereo subcarrier ht and the information carrier it have a positive zero crossing. Thus, the respective in-phase component also has such a zero crossing at that instant, i.e., a sinusoidal shape.

In practice, the phase relations between the pilot signal ps, the subcarrier ht and the information carrier it in the analog or digitized MPX signal sx may be disturbed because preceding filter circuits or digital filters, e.g., in the second decimation circuit d2, cause a phase departure. The separated components of the MPX signal sx then contain interfering signals, such as signal components of the respective other quadrature component, which render the subsequent decoding difficult.

Figure 3A:
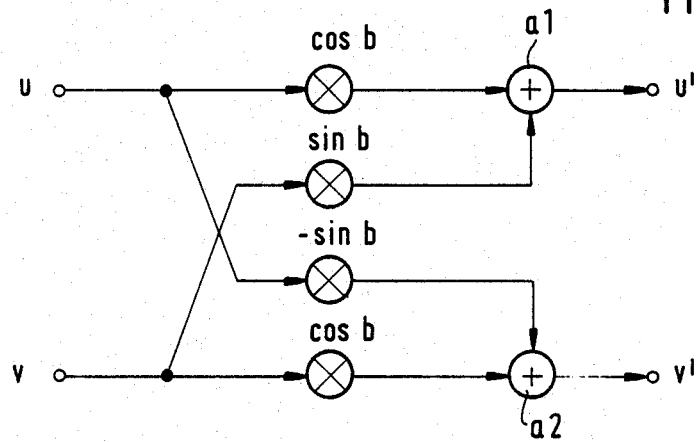
FIGS. 3a and 3b are schematic illustrations of embodiments of the correction circuit for quadrature signal pairs.

To obtain the correct phase position, the first quadrature signal pair pu, pv of the pilot signal ps at zero frequency must be corrected by means of a first correction circuit which rotates these signals through a first correction angle b, as illustrated in FIG. 3a. Similarly, the quadrature signal pair iu, iv of the information signal must be rotated through a second correction angle b by means of a second correction circuit. The respective correction angle b is obtained by evaluating corresponding test signals in the MPX signal sx, for example. The correction circuits may be preset by the manufacturer, and the correction values take the entire receiving circuit into account.

If the pilot signal ps is not present in the MPX signal sx, the phase-locked loop for demodulating the information channel ik may also be completed via the information carrier it and the fourth carrier t4, which is locked to the information carrier it. This requires a conventional phase comparator to which the information carrier it and a signal derived from the system clock cl and having the frequency of the information carrier it are applied.

If, however, the information channel ik contains only the RDS signal, whose carrier is suppressed, and no pilot signal ps is present in the MPX signal sx, the phase-locked loop will be completed as described in Offenlegungsschrift No. DE-A 34 33 592, for example.

FIG. 3a shows schematically an embodiment of the correction circuit. The in-phase signal u is multiplied by the cosine value of the correction angle b and the product is applied to the first input of a first adder a1. The in-phase signal u is also multiplied by the negative sine value of the correction angle b and the product is applied to the first input of a second adder a2. The quadrature signal v is multiplied by the sine value of the correction angle b and the product is applied to the second input of the first adder a1. The quadrature signal v is also multiplied by the cosine value of the correction angle b and the product is applied to the second input of the second adder a2. The output of the first adder a1 is the corrected in-phase output signal u', and the output of the second adder a2 is the corrected quadrature output signal v'.

FIG. 4 shows schematically the waveforms of the five digital carriers t1-t5 in analog representations. The first and second carriers t1, t2 form the first quadrature signal pair. The fourth and fifth carriers t4, t5 form the second quadrature signal pair. FIG. 4 further shows the respective carrier frequency fs belonging to the pilot signal frequency fp. The carrier frequencies fs follow from the smoothed signal waveforms drawn as broken lines. Also given is the associated sampling frequency fa. For the first and third carriers t1, t3, the sampling instants are given as angular values in degrees. All signals except the third carrier t3 have normalized amplitudes of one. The amplitude of the third carrier t3 is $2\sqrt{3}$.

The time relationships between the individual carriers t1-t5 apply to the idealized case where the filter in the second decimation circuit d2 does not shift the phase of the pilot signal ps. If that is not the case, the phase shift of the pilot signal ps can be compensated by the correction circuit shown in FIG. 3a.

The MPX component signals corresponding to the first, third and fourth carriers t1, t3, t4, namely the pilot signal ps, the stereo subcarrier ht and the information carrier it, are given in brackets.

Figure 5:
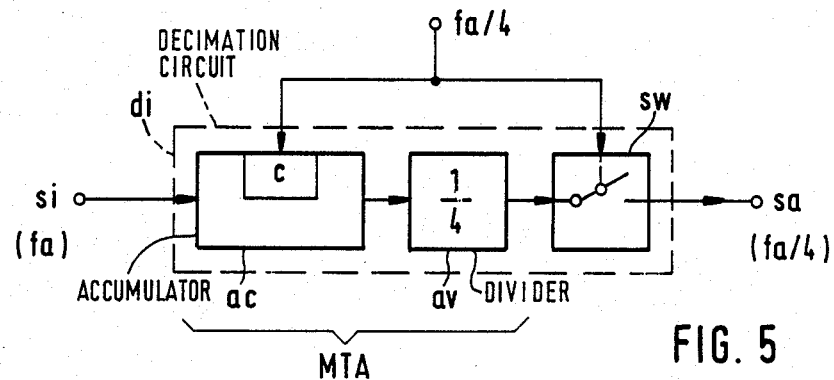
FIG. 5 is a schematic illustration of a particularly simple embodiment of a decimation circuit.

FIG. 5 shows a particularly simple embodiment of a decimation circuit di, which divides the sampling frequency fa of the digitized input signal si by 4. The decimation filter at the input is formed by an accumulator ac, which sums four input sample values until it is reset to zero by a clear signal at its input c. The output of the accumulator ac is divided by 4 in a following divider av. The divided signal is fed out as the decimated signal sa via an electronic switch sw, which is closed only upon receipt of every fourth pulse of the input sampling signal (i.e., at the frequency fa/4).

The subcircuit consisting of the accumulator ac and the divider av is also referred to as a "moving-time averager" (MTA) filter. Its transfer function has a zero at all integral multiples of the decimated sampling frequency.

In FIG. 5, the transfer function is given by:

$$H(z)=(1+z^{-1}+z^{-2}+z^{-3})/A$$

where A is the divisor of the divider av, which is preferably a power of two. For example, in FIG. 5, A has the value 4. This specific decimation circuit di can be used with narrowband signals, such as the information channel ik. In other cases, a more complicated digital lowpass filter may be necessary in front of the electronic switch sw.

The simple MTA filter of FIG. 5 with its comb-like passband curve can be used only if the frequencies of the frequency band to be passed are very low compared with the decimated sampling frequency, because otherwise the higher frequency signal components would be changed in amplitude by the passband curve.

In a high quality stereo transmission method as is described in U.S. Pat. No. 4,485,483, the stereo subcarrier ht is supplemented with a second subcarrier in quadrature therewith, and modulated with additional information. To demodulate this signal, a sixth carrier is necessary which must be in quadrature with the third carrier t3. FIG. 4 shows that, with the scheme of the first and second quadrature signal pairs, this is not possible because the sample values of the third carrier t3 and the sixth carrier would lie at multiples of 60°. Consequently, the sixth carrier would differ in phase from the third carrier t3 by 60° or 120° instead of the desired 90°.

During digital demodulation, the sixth carrier, with the incorrect phase, thus produces as the quadrature component v' not the desired additional signal, but an incorrect component w which differs from the desired component by the angle p (e.g., 30°). However, the desired quadrature component v' can be determined from the incorrect component by rotation through the angle p. This can be done, for example, with the additional correction circuit shown in FIG. 3b.

Figure 3B:
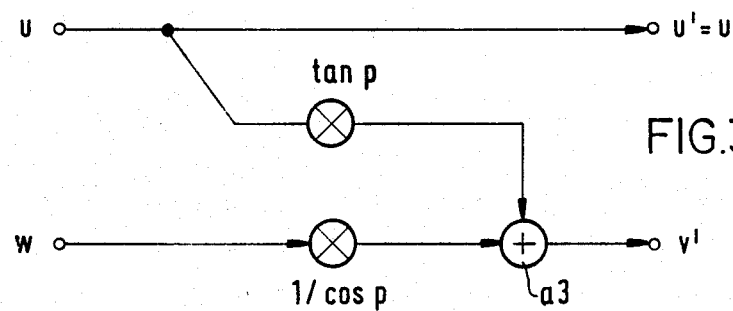

In FIG. 3b, the in-phase signal u' output of the circuit, which need not be corrected, is equal to the in-phase signal u applied at the input of the circuit. The desired quadrature component v' is the sum of the products obtained by multiplying the in-phase signal u by the tangent value of the angle p, and by multiplying the incorrect component w by the reciprocal cosine value of the angle p. A sum of the two products is formed in a third adder a3, whose output is thus the corrected component, namely the desired quadrature component v'.

Since the correction circuits of FIGS. 3a and 3b perform essentially arithmetic signal processing functions, the correction circuits will advantageously be shifted to the above-mentioned decoder portion, which processes the demodulated MPX signal components digitally.

What is claimed is:

1. A digital demodulator that receives a digitized standard stereo multiplex signal, said digitized standard stereo multiplex signal including a pilot signal at a pilot signal frequency and a narrowband information channel, said information channel including an information carrier having a frequency three times said pilot signal frequency, said information channel having an information channel bandwidth, said digital demodulator providing an in-phase information signal, a quadrature information signal, a demodulated stereo sum signal and a demodulated stereo difference signal as outputs, said digital demodulator comprising:

a first decimation circuit which derives a first decimated composite signal from said digitized stereo multiplex signal at a sampling frequency of twelve times said pilot signal frequency and provides said first decimated composite signal as an output;

a second decimation circuit having an input coupled to receive the first decimated composite signal from said first decimation circuit and which generates a second decimated composite signal at a sampling frequency of four times the pilot signal frequency;

a carrier conditioning circuit, said carrier conditioning circuit being part of a phase-locked loop which locks with a selected one of said pilot signal and said information carrier, said carrier conditioning circuit generating first, second, third, fourth and fifth carriers, said first carrier being a digitized sinusoidal carrier and said second carrier being a digitized cosinusoidal carrier, each of said first and second carriers having a carrier frequency equal to said pilot signal frequency, said first and second carriers being sampled at a sampling rate equal to the sampling rate of the second decimated composite signal and having a whole number relationship to said carrier frequency, said first and second carriers being sampled at phase intervals of N times 90°, where N is an integer, to provide a digital word sequence therefrom, said digital word sequence derived from said first carrier being equal to 0, +1, 0, −1, and repeating thereafter, said digital word sequence derived from said second carrier being equal to +1, 0, −1, 0, and repeating thereafter;

said third, fourth and fifth carriers being sampled at twelve times the pilot signal frequency to provide digital word sequences therefrom, said digital word sequences comprising only the values +1, −1, 0, said third carrier having a frequency twice the pilot signal frequency and being sampled at phase intervals of N times 60°, where N is an integer, to provide a digital word sequence therefrom, said digital word sequence being equal to 0, +1, +1, 0, −1, −1, 0 and repeating thereafter;

said fourth and fifth carriers serving as a quadrature signal pair, said fourth and fifth carriers each having a frequency three times the pilot signal frequency and being sampled at phase intervals of N times 90°, where N is an integer, to provide digital word sequences therefrom, said digital word sequence derived from said fourth carrier being equal to 0, +1, 0, −1, 0, and repeating thereafter, said digital word sequence derived from said fifth carrier being +1, 0, −1, 0, +1, and repeating thereafter;

a quadrature demodulator comprising a first digital demodulator and a second digital demodulator, the first and second digital demodulators each being fed by said second decimated composite signal, said first digital demodulator also being fed by said digitized sinusoidal first carrier, said second digital demodulator also being fed by said cosinusoidal second carrier, said first and second digital demodulators providing respective first and second demodulator output signals;

a first digital low-pass filter having an input coupled to receive the first demodulator output signal from said first digital demodulator, said first digital low-pass filter filtering said first demodulator output signal and providing as an output an in-phase component of said pilot signal;

a second digital low-pass filter having an input coupled to receive the second demodulator output signal from said second digital demodulator, said second digital low-pass filter filtering said second demodulator output signal and providing as an output a quadrature component of said pilot signal;

a third digital demodulator having an input and an output, said input coupled to the output of said first decimator to receive said first decimated composite signal, said third digital demodulator also being fed with said third carrier from said carrier conditioning circuit, said third digital demodulator providing a third demodulator output signal;

a third decimation circuit having an input coupled to receive the third demodulator output signal from said third digital demodulator, said third decimation circuit providing a third decimation circuit output signal;

a fourth digital demodulator having an input coupled to receive the first decimated composite signal from said first decimation circuit, said fourth digital demodulator also being fed with said fourth carrier from said carrier conditioning circuit, said fourth digital demodulator providing a fourth demodulator output signal;

a fifth digital demodulator having an input coupled to receive said first decimated composite signal from said first decimation circuit, said fifth digital demodulator being fed with said fifth carrier from said carrier conditioning circuit, said fifth digital demodulator providing a fifth demodulator output signal;

a third low-pass filter and a fourth low-pass filter, each having a passband approximately equal to half said information channel bandwidth, said third low-pass filter having an input coupled to receive said fourth demodulator output signal from said fourth digital demodulator, said third low-pass filter providing said in-phase information signal as an output, said fourth low-pass filter having an input coupled to receive said fifth demodulator output signal from said fifth digital demodulator, said fourth low-pass filter providing said quadrature information signal as an output;

a fifth digital low-pass filter having an input coupled to receive said second decimated composite signal from said second decimation circuit, said fifth digital low-pass filter having a stopband beginning above the maximum audio signal frequency, said fifth digital low-pass filter providing said demodulated stereo sum signal as an output; and a sixth digital low-pass filter having an input coupled to receive said third decimation circuit output signal from said third decimation circuit, said sixth digital low-pass filter having a stopband beginning above the maximum audio signal frequency, said sixth digital low-pass filter providing said demodulated stereo difference signal as an output.

2. A digital demodulator as defined in claim 1, wherein at least one of said first, second, third, fourth, fifth and sixth low-pass filters comprises at least one additional decimation circuit.

3. A digital demodulator as defined in claim 1, wherein said phase-locked loop comprises said carrier conditioning circuit and further comprises a frequency and phase variable oscillator, said phase-locked loop having as a phase comparison signal, a selected one of:
 (i) said quadrature component of the pilot signal;
 (ii) a signal derived from said in-phase information signal; and
 (iii) a signal derived from said quadrature information signal.

4. A digital demodulator as defined in claim 1, further comprising a first correction circuit that rotates the in-phase and quadrature components of said pilot signal by a first correction angle.

5. A digital demodulator as defined in claim 4, wherein said first correction circuit derives a corrected in-phase signal (u') and a corrected quadrature signal (v') from said in-phase component (u) of said pilot signal and said quadrature component (v) of said pilot signal, respectively, according to the following:

$$u' = u \cos b + v \sin b$$

$$v' = v \cos b - u \sin b,$$

where b is the first correction angle.

6. A digital demodulator as defined in claim 4, further comprising a second correction circuit that rotates said in-phase information signal and said quadrature information signal by a second correction angle.

7. A digital demodulator as defined in claim 6, wherein said second correction circuit derives a corrected in-phase signal (u') and a corrected quadrature signal (v') from said in-phase information signal (u) and said quadrature information signal (v), respectively, according to the following:

$$u' = u \cos b + v \sin b$$

$$v' = v \cos b - u \sin b,$$

where b is the second correction angle.

8. A digital demodulator as defined in claim 1, further comprising a correction circuit that rotates said in-phase information signal and said quadrature information signal by a correction angle.

9. A digital demodulator as defined in claim 8, wherein said correction circuit derives a corrected in-phase signal (u') and a corrected quadrature signal (v') from said in-phase information signal (u) and said quadrature information signal (v), respectively, according to the following:

$$u' = u \cos b + v \sin b$$

$$v' = v \cos b - u \sin b,$$

where b is the correction angle.

10. A digital demodulator as defined in claim 1, wherein at least one of said first, second, third, fourth, fifth and sixth low-pass filters comprises a moving-time averaging filter to provide further decimation.

11. A digital demodulator as defined in claim 1, wherein said digital demodulator comprises a single monolithic integrated circuit.

* * * * *